(12) United States Patent
Breitwisch et al.

(10) Patent No.: US 7,864,566 B2
(45) Date of Patent: Jan. 4, 2011

(54) PHASE CHANGE MEMORY PROGRAMMING METHOD WITHOUT RESET OVER-WRITE

(75) Inventors: Matthew J. Breitwisch, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 12/166,934

(22) Filed: Jul. 2, 2008

(65) Prior Publication Data
US 2010/0002499 A1 Jan. 7, 2010

(51) Int. Cl.
*G11C 11/00* (2006.01)
*G11C 7/00* (2006.01)
(52) U.S. Cl. ................... 365/163; 365/148; 365/189.16
(58) Field of Classification Search ................. None
See application file for complete search history.

(56) References Cited
U.S. PATENT DOCUMENTS
2007/0253242 A1* 11/2007 Parkinson et al. ........... 365/163
* cited by examiner

*Primary Examiner*—Hoai V Ho
*Assistant Examiner*—James G Norman
(74) *Attorney, Agent, or Firm*—Ido Tuchman; Vazken Alexanian

(57) ABSTRACT

A method for programming a phase change memory device that avoids RESET overwrite. The method partially comprised of applying a reset write current pulse through the phase change memory element such that the reset write current pulse produces a voltage drop across the phase change memory element less than a reset threshold voltage and greater than a set threshold voltage. The reset write current pulse writing a RESET state to the phase change memory cell. The method additionally comprised of applying a set write current pulse through the phase change memory element such that the set write current pulse produces a voltage drop across the phase change memory element that is equal to or greater than the reset threshold voltage. The set write current pulse writing a SET state to the phase change memory cell.

17 Claims, 3 Drawing Sheets

PHASE CHANGE MEMORY PROGRAMMING METHOD WITHOUT RESET OVER-WRITE

BACKGROUND OF THE INVENTION

1. Field of the Invention

The present invention relates to programming phase change memory and, more specifically, maximizing the effective endurance of the phase change memory elements during memory programming.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). Non-volatile memory is memory in which the state of the memory elements can be retained for days to decades without power consumption.

On the other hand, volatile memory requires continual input of energy in order to retain information. Examples of volatile memory devices include Dynamic Random Access Memory (DRAM) and Static Random Access Memory (SRAM). DRAM requires the memory element to be repeatedly refreshed while SRAM requires a constant supply of energy to maintain the state of the memory element.

The present invention is directed to phase change memory. Phase change memory stores information in materials that can be manipulated into different phases. Each of these phases exhibit different electrical properties which can be used for storing information. The amorphous and crystalline phases are typically two phases used for binary storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be Ge2Sb2Te5 (GST), SbTe, and In2Se3.

One drawback of phase change memory is degradation of the phase change material with repeated read-write phase change cycles. The phase change material may phase segregate, undergo local variations in stoichiometry, and the dopant atoms may redistribute themselves. Thus, it is desirable to devise a solution to prevent problems associated with repeated phase change cycles in phase change memory devices.

SUMMARY OF THE INVENTION

One aspect of the invention is a method for programming a phase change memory cell. The phase change memory cell includes a phase change memory element. The phase change memory element includes a reset threshold voltage and a set threshold voltage. The reset threshold voltage is the voltage drop across the phase change memory element in the reset state that must be overcome to melt the phase change memory element by ohmic heating. The set threshold voltage is the voltage drop across the phase change memory element in the set state that must be overcome to melt the phase change memory element by ohmic heating.

The method includes receiving a first write signal to store a reset state in the phase change memory cell. A reset write current pulse is then applied through the phase change memory element. The reset write current pulse produces a voltage drop across the phase change memory element that is less than the reset threshold voltage for the phase change memory element and greater than the set threshold voltage for the phase change memory element.

Another aspect of the invention is a phase change memory device. The phase change memory device includes a plurality of phase change memory cells. Each phase change memory cell includes a phase change memory element. The phase change memory device also includes a write circuit configured to apply the reset write current pulse through the phase change memory element. The reset write current pulse produces a voltage drop across the phase change memory element that is less than the reset threshold voltage for the phase change memory element and greater than the set threshold voltage for the phase change memory element.

Yet another aspect of the invention is a method for programming a phase change memory cell. The phase change memory cell including a phase change memory element. The method includes receiving a first write signal to store a reset state in the phase change memory cell. The method then applies the reset write current pulse through the phase change memory element such that the phase change element melts when in a low resistance state and does not melt when in a high resistance state.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
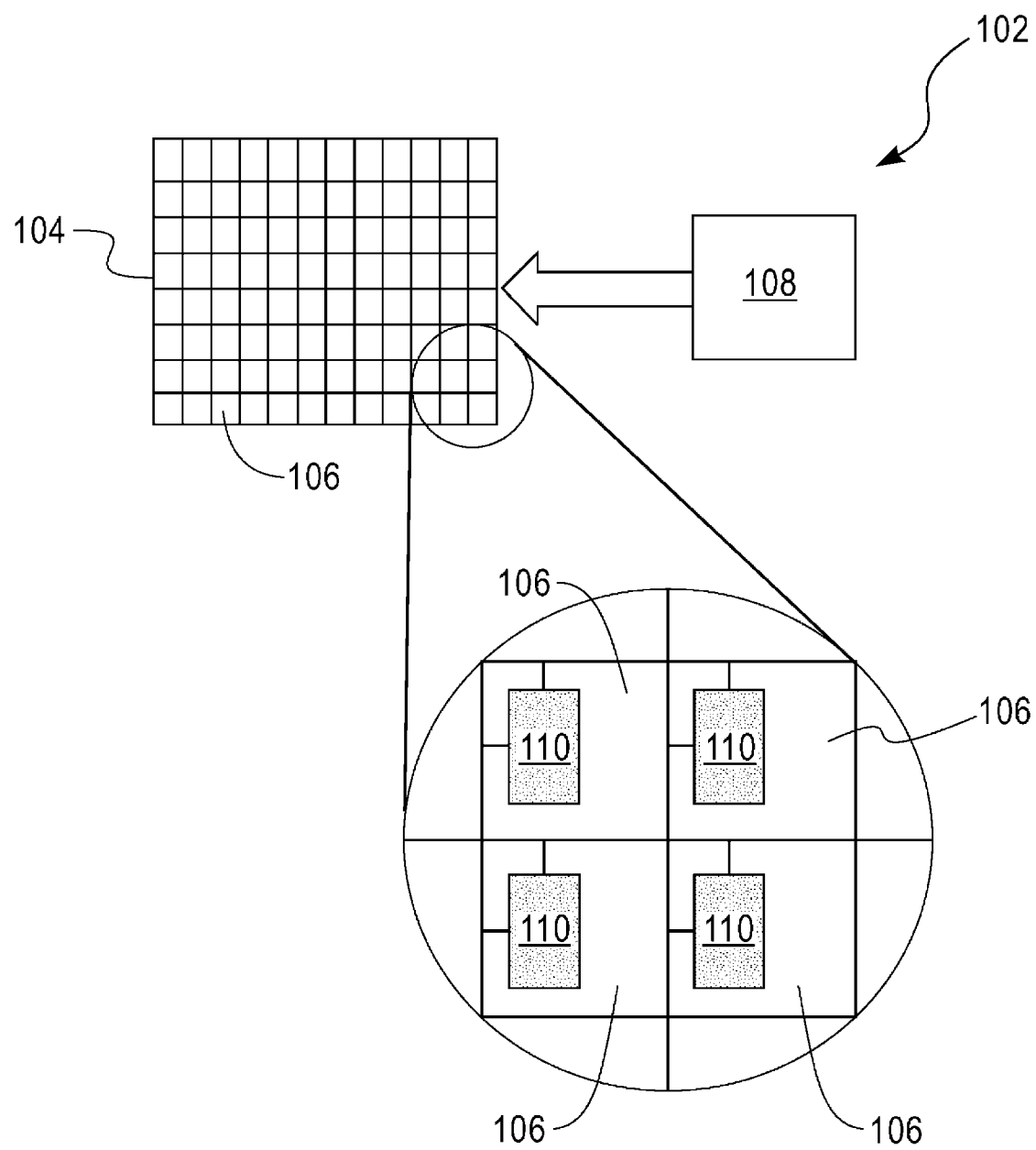
FIG. 1 illustrates a phase change memory device with a plurality of phase change memory cells.

The present invention is described with reference to embodiments of the invention. Throughout the description of the invention reference is made to FIGS. 1-3.

As described in detail below, an aspect of the current invention is a method of operating and programming a phase change memory device containing a plurality of phase change memory cells. Each individual phase change memory cell contains a phase change memory element comprised of a phase change material, such as Germanium-Antimony-Tellurium (GST).

Typically, the phase change memory element may be programmed to one of two states: a SET state or a RESET state. For example, the SET state may represent a stored "0" value and the RESET state may represent a stored "1" value. In the SET state, the phase change element has a relatively low resistance crystalline state. On the other hand, in the RESET state, the phase change element has a relatively high resistance amorphous state.

Changing a phase change element's state requires heating the material to a melting point and then cooling the material to one of the two states. The present invention employs ohmic heating to melt the phase change element. In one configuration of the invention, ohmic heating is carried out by applying a voltage across the phase change element. As current flows through the element, the element is heated.

The SET state and RESET state of the phase change memory element require different threshold voltages to melt the phase change memory element. As used herein, the RESET threshold voltage is the voltage drop across the phase change memory element in the RESET state that must be overcome to melt the phase change memory element by ohmic heating. The SET threshold voltage is the voltage drop across the phase change memory element in the SET state that must be overcome to melt the phase change memory element by ohmic heating.

The threshold voltage for the phase change memory element in the RESET state is comparatively higher than the threshold voltage for the phase change memory element in the SET state. Therefore, it is possible to apply a program voltage that melts the phase change memory element in the SET state but not in the RESET state.

Normally when the initial state of the phase change memory element is the RESET state, a RESET overwrite occurs when writing to the RESET state. RESET overwrite is the process when the initial RESET state in the phase change memory element is melted, cooled, and reprogrammed back to the RESET state. As the phase change memory element undergoes a greater number of melting and cooling processes, phase segregation begins to occur in the phase change material in the phase change memory element. That is, the crystalline state and the amorphous states permanently separate into certain regions of the phase change memory element.

By eliminating a RESET overwrite, the phase change memory element undergoes fewer melting and cooling processes. By reducing the number of melting and cooling processes the endurance of the phase change memory cells in the phase change memory devices may be increased.

In FIG. 1, an embodiment of the invention is illustrated. The phase change memory device 102 is comprised of a phase change memory array 104 and a write circuit 108. The phase change memory array 104 is comprised of a plurality of phase change memory cells 106. Each phase change memory cell 106 contains a phase change memory element 110. As described above, the phase change memory element 110 is comprised of phase change material capable of being programmed to either a SET state or a RESET state.

In an alternate embodiment of the invention, the phase change memory device 102 further includes a memory controller (not shown) that may aid in the operation and programming of phase change memory cells 106. The write circuit 108 may or may not be incorporated in the memory controller.

The phase change memory array 104 is organized into rows and columns (bit-line and word-line). Each phase change memory cell 106 has a distinct memory address (a bit-line address and a word-line address). In this embodiment of the invention the write circuit 108 is paired with the phase change memory array 104. In an alternate embodiment of the invention, the write circuit 108 is incorporated into the phase change memory array 104 and each bit-line has a paired write circuit 108. The write circuit 108 is configured to apply a write current pulse to the phase change memory cells 106, thereby programming the phase change memory cells 106.

The specific write current pulse applied to the phase change memory cell 106 depends on the desired state of the phase change memory cell 106. The write circuit 108 is required to produce a relatively low current pulse with a gradual trailing edge (a SET write current pulse) when writing the SET state in the phase change memory cell 106. The write circuit 108 is required to produce a relatively high current pulse with an abrupt trailing edge (a RESET write current pulse) when writing the RESET state in the phase change memory cell 106.

As stated above, programming an individual phase change memory cell 106 in the SET state requires a current pulse producing a relatively low voltage drop (SET threshold voltage) across the phase change memory element 110. Programming an individual phase change memory cell 106 in the RESET state requires a current pulse producing a relatively high voltage drop (RESET threshold voltage) across the phase change memory element 110. Additionally, when the phase change memory element 110 is in the RESET state, a critical voltage must be overcome before current may begin to flow through the phase change memory element 110. Thus, the SET threshold voltage and the RESET threshold voltage must be overcome in order to write to the phase change memory cell 106 regardless of the desired programming state.

In an embodiment of the invention, when the write circuit 108 is required to write the RESET state to a specific phase change memory cell 106 the write circuit 108 applies the RESET write current pulse producing a voltage drop across the phase change memory element 110 greater than the SET threshold voltage and less than the RESET threshold voltage. The phase change element is melted only when the phase change memory cell 106 is in the SET state, and is not melted in the RESET state. In doing so RESET overwrite is avoided.

When the write circuit 108 is required to write the SET state to a specific phase change memory cell 106 the write circuit 108 applies the SET write current pulse producing a voltage drop across the phase change memory element 110 greater than both the SET threshold voltage and the RESET threshold voltage. The phase change element is either melted and then cooled gradually so that it ends in the crystalline phase, or heated above the crystallization temperature of the phase change material for a duration sufficient to crystallize the phase change material, when the phase change memory cell 106 is in both the SET state and the RESET state.

Figure 2:
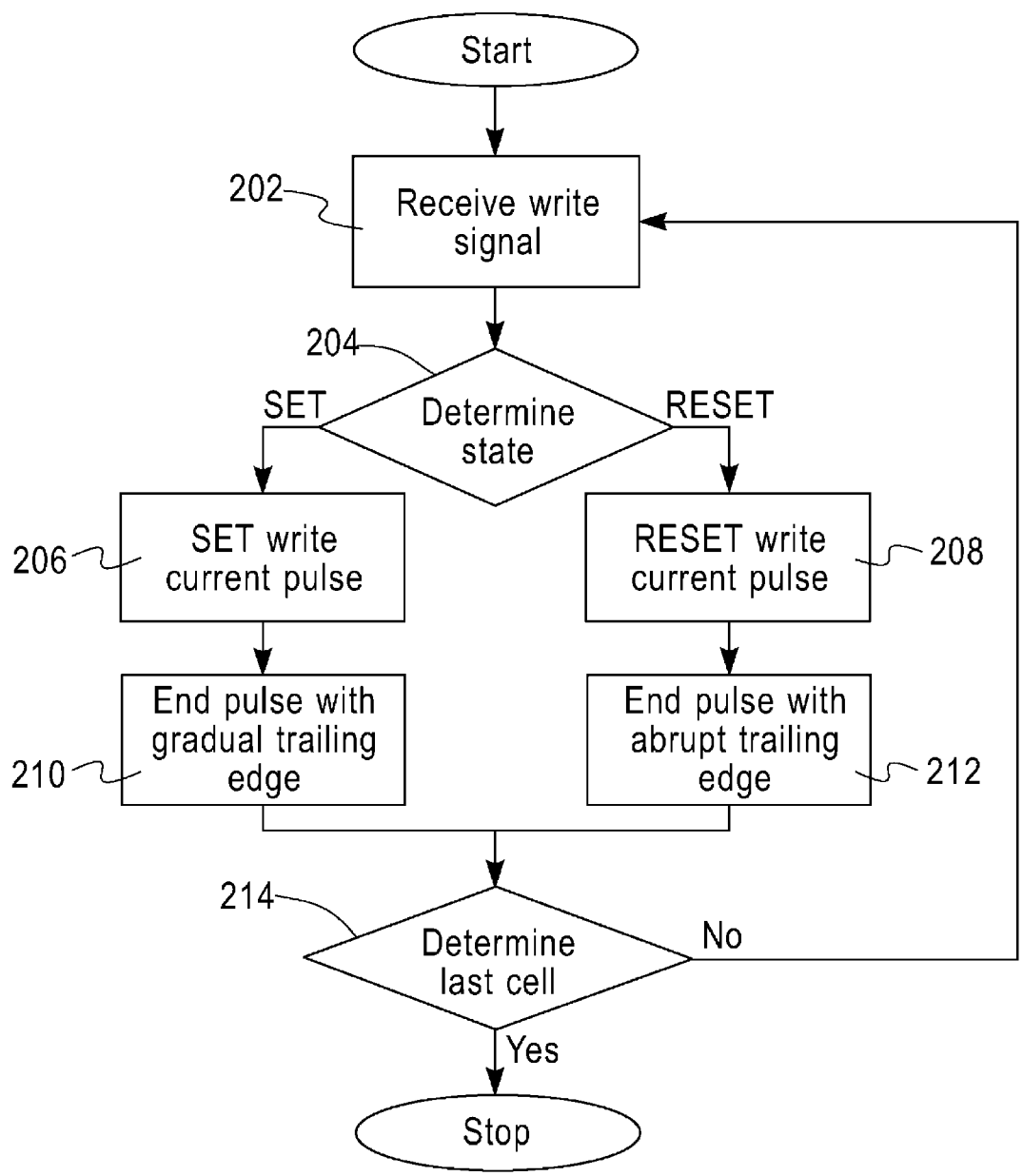
FIG. 2 illustrates a process flow for the phase change memory device.

FIG. 2 illustrates one embodiment of the invention for operating the phase change memory device. Operation of the phase change memory device allows the writing of the SET state and the RESET state to individual phase change memory cells or to groups of phase change memory cells. The operations depicted in FIG. 2 can be implemented in software, firmware, hardware or some combination thereof. Program code logic may be stored in a storage medium, loaded into and/or executed by a computer, wherein, when the program code logic is loaded into and executed by a computer, the computer becomes an apparatus for practicing the invention. Examples of storage medium include solid state memory (RAM or ROM), floppy diskettes, CD-ROMs, hard drives, universal serial bus (USB) flash drives, or any other computer-readable storage medium.

Process flow of the operation begins at receiving operation 202. During this operation, the write circuit receives the data from a source such as a central processing unit (CPU) or an external memory controller. The data may include the memory address for the phase change memory cell that must be programmed and what data must be stored. In an alternate embodiment of the invention, the memory controller may handle the memory address identification. After the receiving operation 202 is completed, control passes to determining operation 204.

At determining operation 204, the write circuit determines the write state that is required for the phase change memory cell. In an alternate embodiment, the memory controller may determine the state that is required for the phase change memory cell. If the phase change memory cell must be programmed to the SET state, control passes to a SET write operation 206. If the phase change memory cell must be programmed to the RESET state, control passes to RESET write operation 208.

At SET write operation 206, the write circuit applies the SET write current pulse to the bit-line associated with the phase change memory cell. As stated above, the SET write current pulse is applied through the phase change memory element such that the SET write current pulse produces a voltage drop across the phase change memory element that is equal to or greater than the RESET threshold voltage. Regardless of the state of the phase change memory element prior to programming, the phase change memory element begins to reach a temperature sufficient to crystallize or melt at a relatively low current pulse due to ohmic heating. After SET write operation 206 is completed, control passes to end pulse operation 210.

At end pulse operation 210, the write circuit ends the SET write current pulse with a gradual trailing edge. This allows the phase change material in the phase change memory element to slowly cool down and crystallize. The trailing edge of the SET write current pulse may be regulated by the write circuit or by a separate quench transistor. After end pulse operation 210 is completed, control passes to determining operation 214.

Alternately, at RESET write operation 208, the write circuit applies the RESET write current pulse to the bit-line associated with the phase change memory cell. As stated above, the RESET write current pulse is applied through the phase change memory element such that the RESET write current pulse produces a voltage drop across the phase change memory element that is less than the RESET threshold voltage for the phase change memory element and greater than the SET threshold voltage for the phase change memory element. If the phase change memory element was in the SET state prior to programming, the phase change memory element begins to melt at a relatively high current pulse due to ohmic heating. If the phase change memory element was in the RESET state prior to programming, the pulse will beneficially fail to melt the phase change memory element. After the RESET write operation 208 is completed, control passes to end pulse operation 212.

At end pulse operation 212, the write circuit ends the RESET write current pulse with an abrupt trailing edge. This operation quenches the phase change material in the phase change memory element. The phase change material is prevented from crystallizing over time and is frozen in the amorphous state. The trailing edge of the RESET write current pulse may be regulated by the write circuit or by the separate quench transistor (as mentioned above). After end pulse operation 212 is completed, control passes to determining operation 214.

At determining operation 214, a determination is made whether or not the phase change memory cell programmed is the last phase change memory cell that requires programming. If it is the last phase change memory cell that requires programming then the process flow ends. Determining operation 214 can be performed by the write circuit or, in an alternate embodiment of the invention, by the memory controller. If the phase change memory cell programmed is not the last phase change memory cell that requires programming then control passes back to receiving operation 202.

Those skilled in the art will appreciate that the operations discussed for programming an individual memory cell can be applied equally to multiple memory cells at once. Thus, simultaneous programming of a set of memory cells by the process discussed above is contemplated in an embodiment of the invention.

Figure 3:
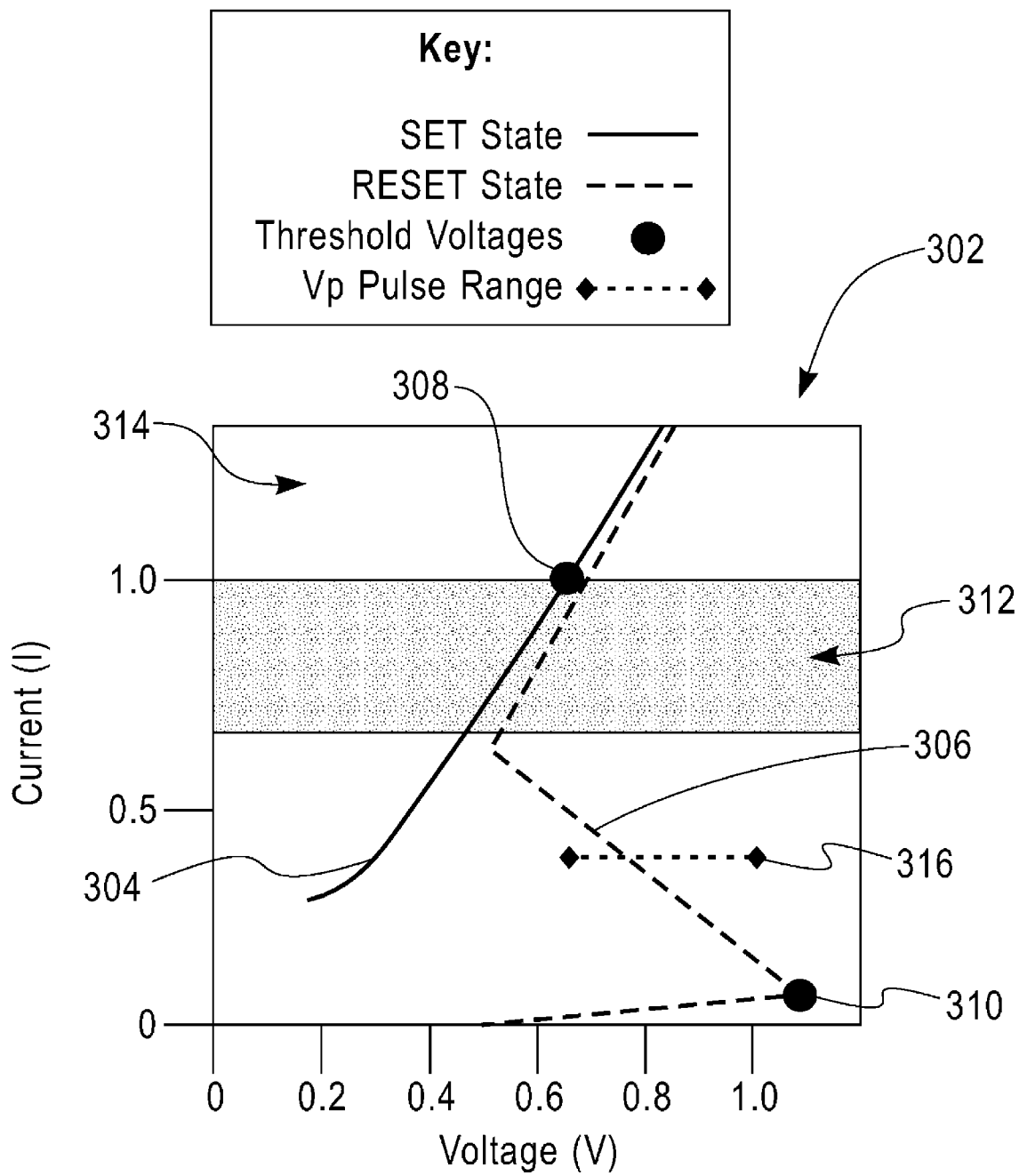
FIG. 3 illustrates a voltage vs. current graph of phase change memory elements in the phase change memory cells.

Now turning to FIG. 3, a voltage vs. current graph 302 of phase change memory elements in the phase change memory cells is illustrated. The voltage drop across the phase change memory element is located on the x-axis. The current passing through the phase change memory element is located on the y-axis. Note that the values on the graph 302 are illustrative and do not necessarily reflect actual measured values for a specific phase change material. A SET write current regime 312 is the current range for programming the phase change memory element to the SET state. A RESET write current regime 314 is the current range for programming the phase change memory element to the RESET state.

As illustrated by the graph 302, when the phase change memory element is in the SET state prior to programming, as shown by SET state line 304 (solid line), the current and voltage increase in a fairly linear manner. The SET threshold voltage 308 occurs at the top of the SET state current range 312. The phase change material in the phase change memory element begins to melt due to ohmic heating caused by the current passing through. Thus, whenever a current pulse, whether it be the SET write current pulse or the RESET write current pulse, produces a sufficiently large enough current passing through the phase change memory element the phase change material in the phase change memory element will begin melting.

When the phase change memory element is in the RESET state prior to programming, as shown by RESET state line 306 (dashed line), the current increases slowly as the voltage drop across the phase change memory element increases. This is a result of the relatively high resistance RESET state. The RESET threshold value 310 is the point when the voltage drop across the phase change memory element reaches a critical point and the voltage 'snaps back'. The resistance of the phase change material in the phase change memory element falls allowing the current pulse to melt the phase change memory element by ohmic heating. Thus, if a current pulse, such as the RESET current pulse, does not produce a sufficiently large enough voltage drop across the phase change memory element the phase change material in the phase change memory element will not begin melting. This reduces the number of melting and cooling cycles induced on a particular phase change memory cell and increases the endurance of the phase change memory cell.

As stated above, the SET write current pulse produces a voltage drop greater than both the SET threshold voltage 308 and the RESET threshold voltage 310. The RESET write current pulse produces a voltage drop greater than the SET threshold voltage 308 but less than the RESET threshold voltage 310. A Vp pulse range 316 is also shown on the graph 302 indicating the ideal range for the voltage drop across the phase change memory element created by the RESET write current pulse. The pulse range 316 can be tailored by manipulating the geometry of the phase change memory element in the phase change memory cells and/or by changing the phase change material in the phase change memory element. For example, in a bridge phase change memory cell, the length of the bridge will increase the RESET voltage threshold. Thus, an ideal range can be tuned for the RESET write current pulse.

Having described preferred embodiments for the phase change memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for programming a phase change memory cell, the phase change memory cell including a phase change memory element, the method comprising:
   receiving a first write signal to store a high reset (amorphous) state in the phase change memory cell; and
   applying a reset write current pulse through the phase change memory element when the phase change memory cell is already in the reset state such that the reset write current pulse produces a voltage drop across the phase change memory element that is less than a reset threshold voltage for the phase change memory element and greater than a set threshold voltage for the phase change memory element;
   wherein the reset threshold voltage is the voltage drop across the phase change memory element in the reset state that must be overcome to melt the phase change memory element by ohmic heating; and
   wherein the set threshold voltage is the voltage drop across the phase change memory element in the set (crystalline) state that must be overcome to melt the phase change memory element by ohmic heating.

2. The method of claim 1, wherein the reset write current pulse has an abrupt trailing edge.

3. The method of claim 1, further comprising:
   receiving a second write signal to store a set state in the phase change memory cell; and
   applying a set write current pulse through the phase change memory element such that the set write current pulse produces a voltage drop across the phase change memory element that is equal to or greater than the reset threshold voltage.

4. The method of claim 3, wherein the set write current pulse has a gradual trailing edge.

5. The method of claim 1, wherein the reset threshold voltage is a critical voltage across the phase change memory element in the phase change memory cell that must be overcome in the reset state to switch from a higher resistive state to a lower resistive state.

6. The method of claim 1, wherein the set threshold voltage is the critical voltage across the phase change memory element in the phase change memory cell that must be overcome in the set state to melt the phase change memory element by ohmic heating.

7. A phase change memory device, the phase change memory device comprising:
   a plurality of phase change memory cells, each memory cell including a phase change memory element; and
   a write circuit configured to apply a reset write current pulse through the phase change memory element when the phase change memory cell is already in the reset state such that the reset write current pulse produces a voltage drop across the phase change memory element that is less than a reset threshold voltage for the phase change memory element and greater than a set threshold voltage for the phase change memory element;
   wherein the reset threshold voltage is the voltage drop across the phase change memory element in the reset state that must be overcome to melt the phase change memory element by ohmic heating; and
   wherein the set threshold voltage is the voltage drop across the phase change memory element in the set state that must be overcome to melt the phase change memory element by ohmic heating.

8. The phase change memory device of claim 7, wherein the reset write current pulse has an abrupt trailing edge.

9. The phase change memory device of claim 7, wherein the write circuit is further configured to apply a set write current pulse through the phase change memory element such that the set write current pulse produces a voltage drop across the phase change memory element that is equal to or greater than the reset threshold voltage.

10. The phase change memory device of claim 9, wherein the set write current pulse has a gradual trailing edge.

11. The phase change memory device of claim 7, wherein the threshold voltage is a critical voltage across the phase change memory element in the phase change memory cell that must be overcome in the reset state to switch from a higher resistive state to a lower resistive state.

12. The phase change memory device of claim 7, wherein the set threshold voltage is the critical voltage across the phase change memory element in the phase change memory cell that must be overcome in the set state to melt the phase change memory element by ohmic heating.

13. A method for programming a phase change memory cell, the phase change memory cell including a phase change memory element, the method comprising:
   receiving a first write signal to store a high resistance state in the phase change memory cell; and
   applying a reset write current pulse through the phase change memory element when the phase change memory cell is already in the high resistance state such that the reset write current pulse produces a voltage drop across the phase change memory element that is less than a reset threshold voltage for the phase change memory element and greater than a set threshold voltage for the phase change memory element;
   wherein the reset threshold voltage is the voltage drop across the phase change memory element in the reset state that must be overcome to melt the phase change memory element by ohmic heating; and
   wherein the set threshold voltage is the voltage drop across the phase change memory element in the set (crystalline) state that must be overcome to melt the phase change memory element by ohmic heating.

14. The method of claim 13, wherein the reset write current pulse has an abrupt trailing edge.

15. The method of claim 13, further comprising:
   receiving a second write signal to store a set state in the phase change memory cell; and
   applying a set write current pulse through the phase change memory element such that the phase change element melts when in a low resistance state and a high resistance state.

16. The method of claim 13, further comprising:
   receiving a second write signal to store a set state in the phase change memory cell; and
   applying a set write current pulse through the phase change memory element such that the phase change element exceeds its crystallization temperature when in a low resistance state and a high resistance state.

17. The method of claim 15, wherein the set write current pulse has a gradual trailing edge.

* * * * *